(12) United States Patent
Wertz et al.

(10) Patent No.: US 7,619,895 B1
(45) Date of Patent: Nov. 17, 2009

(54) SOCKET CONNECTOR WITH FLEXIBLE ORIENTATION HEAT PIPE

(75) Inventors: Darrell Wertz, Chandler, AZ (US); David Gregory Howell, Chandler, AZ (US); Albert Terhune, Chandler, AZ (US); Ming-Lun Szu, Tu-cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/157,372

(22) Filed: Jun. 9, 2008

(51) Int. Cl.
*H05K 7/20* (2006.01)
(52) U.S. Cl. .................................................... 361/719
(58) Field of Classification Search ................. 361/685, 361/687, 699, 700, 717, 718, 819, 720; 174/15.2; 165/46; 257/714, 715, 722
See application file for complete search history.

(56) References Cited

U.S. PATENT DOCUMENTS

| | | | |
|---|---|---|---|
| 6,473,305 B1 * | 10/2002 | Gordon et al. .............. 361/704 |
| 6,708,754 B2 * | 3/2004 | Wei .............................. 165/46 |
| 6,712,129 B1 * | 3/2004 | Lee ........................ 165/104.21 |
| 6,883,594 B2 * | 4/2005 | Sarraf et al. ........... 165/104.33 |
| 6,961,243 B2 * | 11/2005 | Shih-Tsung ................. 361/700 |
| 7,008,239 B1 | 3/2006 | Ju |

\* cited by examiner

*Primary Examiner*—Chandrika Prasad
(74) *Attorney, Agent, or Firm*—Andrew C. Cheng; Wei Te Chung; Ming Chieh Chang

(57) ABSTRACT

A socket connector, adapted for electrically connecting an IC package and a printed circuit board, comprises a frame, an insulative housing, a cover plate, a heat pipe retainer, two heat pipes, a backplane, and a plurality of fastening members. The insulative housing is located in and surround by the metal substrate frame. The heat pipe retainer with the heat pipes are seated on the IC package received in the insulative housing. The cover plate is on the heat pipe retainer. The fastening member fastens the frame, the cover plate and the backplane together and to the printed circuit board. The heat pipe retainer is formed with a post in a center thereof, and the cover plate is formed with a hole receiving the post, so that the heat pipe retainer is flexibly orientated and can rotates around the hole.

20 Claims, 4 Drawing Sheets

SOCKET CONNECTOR WITH FLEXIBLE ORIENTATION HEAT PIPE

BACKGROUND OF THE INVENTION

1. Field of the Invention The present invention relates to a socket connector which is used for connecting an electronic package, such as a central processing unit (CPU), with a circuit substrate, such as a printed circuit board (PCB).

2. Description of the Prior Art

U.S. Pat. No. 7,008,239, issued on Mar. 7, 2006, discloses a socket connector mounted on a printed circuit board (PCB). The socket includes an insulative housing, a plurality of contacts, four screw nuts and four screws, a lid and a heat guide pipe. The insulative housing has a plurality of slots for receiving the contacts and a border projecting therefrom and around the slots for orientating an electronic component, such as an IC module. The screw nuts connect the insulative housing to the PCB from a bottom side of the PCB, the screws engage with the screw nuts from a top side of the PCB. The lid is arranged between the screws and the insulative housing. A head of each screw presses the lid to urge the top surface of the IC module for positioning the IC module in the insulative housing. The heat guide pipe is assembled on a top surface of the lid and connects with a heat dissipation device for further heat dissipation. However, since the lid which is assembled with the heat guide pipe is firmly retained to the insulative housing, an extending direction of the heat guide pipe is determinate once the lid is assembled to the insulative housing. So a field on the printed circuit board for a heat dissipation which connects the heat pipe is limited.

Accordingly, a new socket connector that solves the above problems is desirable.

SUMMARY OF THE INVENTION

Accordingly, an object of the present invention is to provide a socket connector which has flexibly orientated heat pipes.

To fulfill the above object, a socket connector for electrically connecting an IC package and a printed circuit board, comprises an insulative housing defining a space for the IC package, a heat pipe retainer assembled with at least one heat pipe and seated on the IC package received in the insulative housing; and a cover plate located upon the heat pipe retainer and retained to the printed circuit board. One of the cover plate and the heat pipe retainer has a post, and the other defines a hole rotatably receiving the post to flexibly orientate the heat pipe retainer with the heat pipe.

Other objects, advantages and novel features of the present invention will become more apparent from the following detailed description when taken in conjunction with the accompanying drawings, in which:

DESCRIPTION OF PREFERRED EMBODIMENTS OF THE INVENTION

Reference is now made to the drawings to describe the invention in detail.

Figure 1:
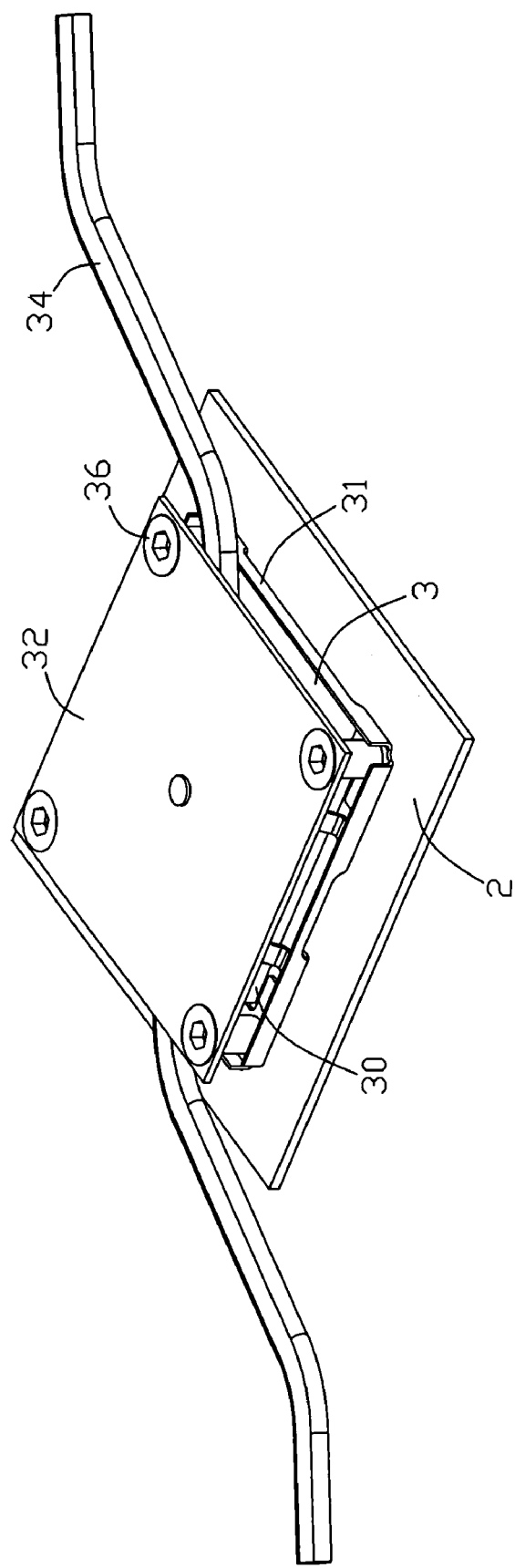
FIG. 1 is an assembled, perspective view of a socket connector receiving an IC package and mounted on a printed circuit board, in accordance with the present invention.
Figure 2:
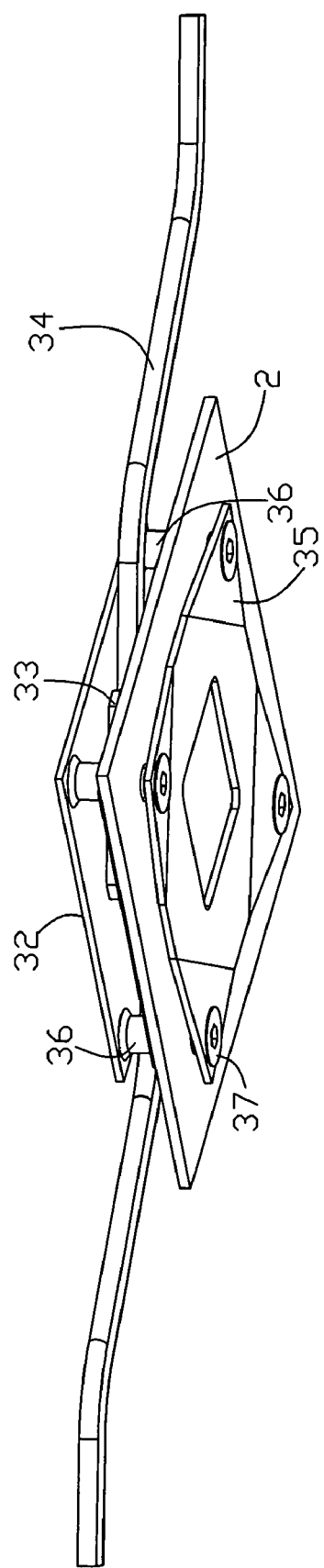
FIG. 2 is similar to FIG. 1, taken from a bottom side.
Figure 3:
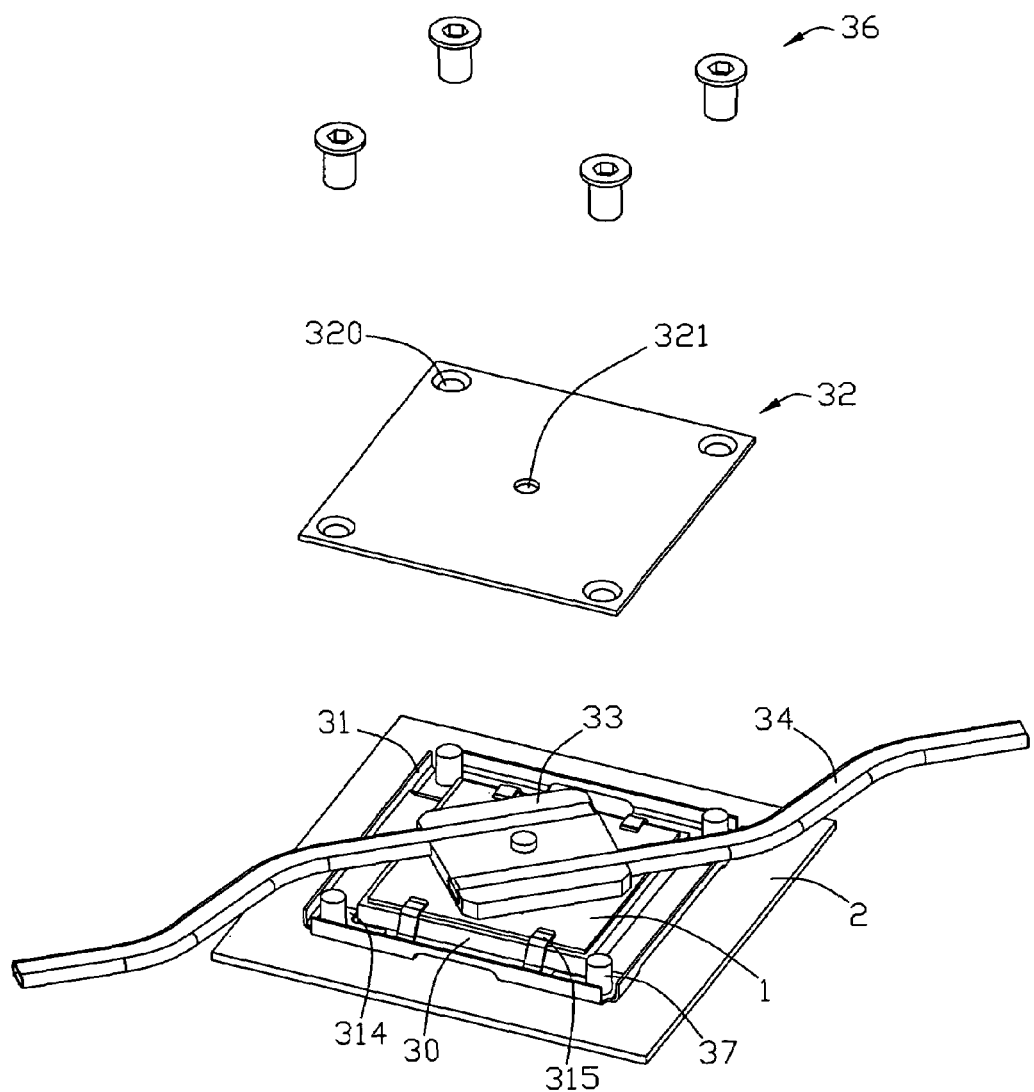
FIG. 3 is a partially assembled, perspective view of the socket connector in FIG. 1, wherein a top plate is removed from the socket connector.
Figure 4:
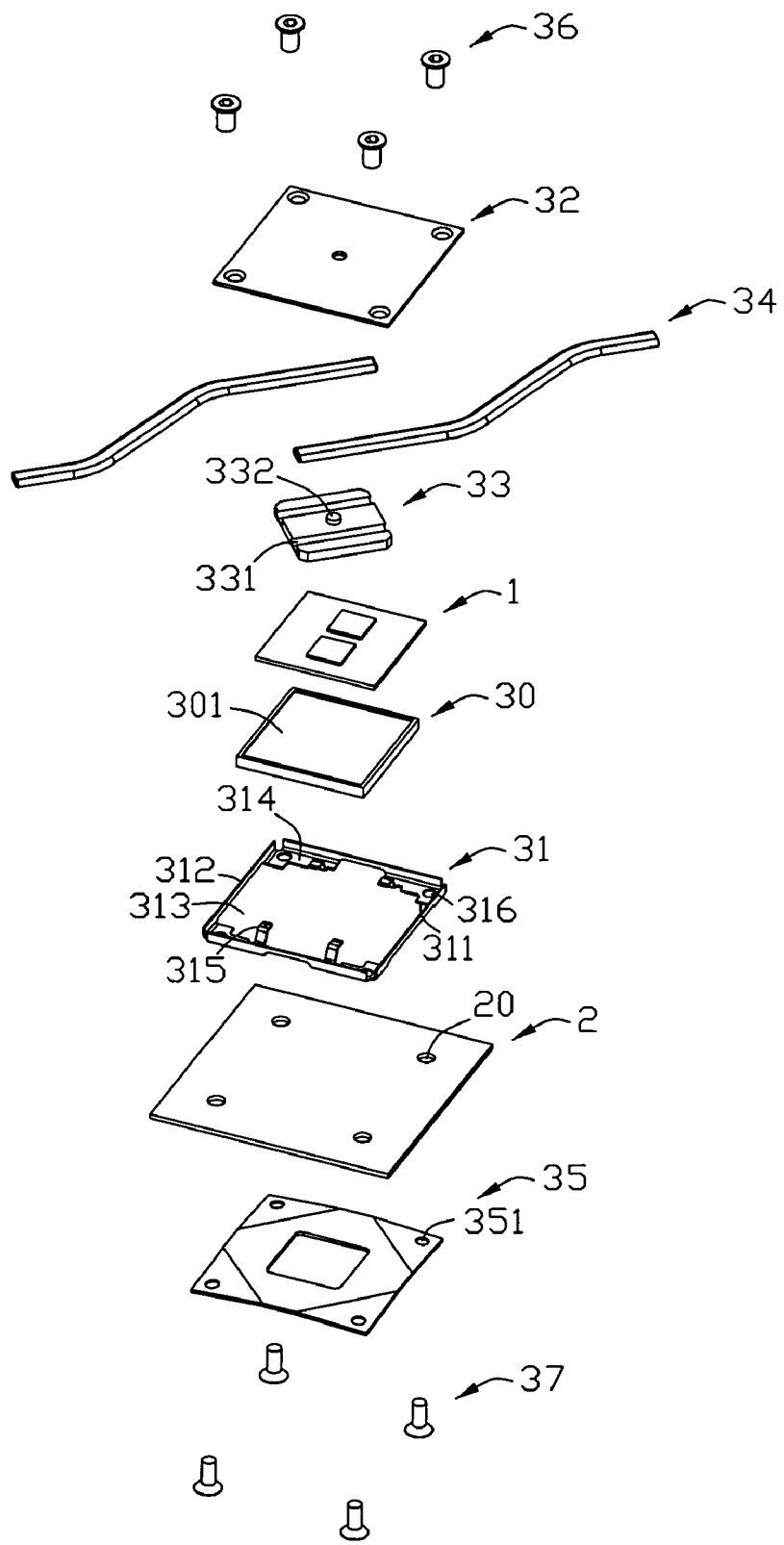
FIG. 4 is an exploded, perspective view of the socket connector in FIG. 1.

Referring to FIGS. 1-4, a socket connector 3 in accordance with a preferred embodiment of the present invention is shown, which is adapted for electrically connecting an IC package 1 and a printed circuit board 2.

The socket connector 3 comprises an insulative housing 30, a metal substrate frame 31, a cover plate 32, a heat pipe retainer 33, two heat pipes 34, a backplane 35, and a plurality of fastening members. The insulative housing 30 is located in and surround by the metal substrate frame 31. The heat pipe retainer 33 with the heat pipes 34 are seated on the IC package 1 received in the insulative housing 30. The cover plate 32 is covered on the heat pipe retainer 33. The fastening member comprises an upper screw nut 36 and a lower screw 37 and fastens the frame 31, the cover plate 32 and the backplane 35 together and to the printed circuit board 2.

The insulative housing 30 defines a space 301 for the IC package 2 and receives a plurality of terminals (not shown). The frame 31 is stamped from a metal piece and in a rectangle shape, the frame 31 is formed with a bottom plate 311 and four sidewalls 312. The bottom plate 311 comprises an opening 313 and four pieces 314 connecting bottom edges of two adjacent sidewalls 311 and located in four corners of the opening 313. The insulative housing 30 is located in the opening 313 of the frame 31. The frame 31 further has a plurality of spring fingers 315, which upwardly and inwardly extend from the pieces 314 into the opening 313 to press and retain the insulative housing 30 in the opening 313. Each piece 314 defines a mounting hole 316.

The cover plate 32 is located upon the heat pipe retainer 33 and covers the insulating housing 30. The cover plate 32 is piece-like and has four retaining holes 320 in four corners thereof corresponding to the mounting holes 316 and a hole 321 in a center thereof. covers the insulative housing 30 and located. The heat pipe retainer 33 is a metal clump and is formed with two grooves 331 for accommodating the heat pipes 34 and a post 332 in a center thereof for engaging with the hole 321 of the cover plate 32. The printed circuit board 2 defines four assembling holes 20 corresponding to the mounting holes 316.

The backplane 35 is rectangle piece-like and has four through holes 351 corresponding to the mounting holes 316. The backplane 35 is located on an inverse side of the printed circuit board 2.

When assembly, firstly put the frame 31 on the printed circuit board 2 with the mounting holes 316 aligning with the assembling holes 20 of the printed circuit board 2, and put the insulative housing 30 into the opening 313 of the frame 31 and the IC package 2 into the space 301 of the insulative housing 30. Then, locate the heat pipe retainer 33 assembled with the heat pipes 34 on the IC package 2, and put the cover plate 32 upon the heat pipe retainer 33 with the post 332 inserting into the hole 321 and the retaining holes 320 aligning with the mounting holes 316. Finally, put the backplane 35 below the printed circuit board 2 and make the screws 37 pass through the through holes 351 of the backplane 35, the assembling holes 20 of the printed circuit board 2, the mounting holes 316 of the frame 31, in turn, and make the screw nuts 36 pass through the retaining holes 320 of the cover plate 32 and engage with the screws 37 from a top side of the printed circuit board 2, so the socket connector 3 is mounted on the printed circuit board 2.

What we should emphasize is that the heat pipe retainer 33 is pivotally assembled to the cover plate 32 by the hole 321 rotatably receiving the post 332, so the heat pipe retainer 33 with the heat pipes 34 is flexibly orientated and can rotate around the post 332, even the socket connector 3 is mounted on the printed circuit board 2. Since the heat pipe 34 is located between two adjacent screws 37 (referring to FIG. 2), so the two screws 37 can prevent the heat pipe retainer 33 from further rotating to orientate the heat pipe retainer 33. For this characteristic, operator may have more options to configure the layout for the heat pipes 34.

Furthermore, although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. A socket connector for electrically connecting an IC package and a printed circuit board, comprising:
    an insulative housing defining a space for the IC package;
    a heat pipe retainer assembled with at least one heat pipe and mounted upon the IC package received in the space of the insulative housing;
    a cover plate located upon the heat pipe retainer and substantially covering the heat pipe retainer and the at least one heat pipe; and
    wherein one of the cover plate and the heat pipe retainer has a post, and the other defines a hole rotatably receiving the post to flexibly orientate the heat pipe retainer with the heat pipe.

2. The socket connector of claim 1, wherein the post is formed in a center of the heat pipe retainer, and the hole is formed in a center of the cover plate, the heat pipe retainer can rotates around the hole, the heat pipe retainer defines at least one groove recessed from a top surface thereof, the at least one heat pipe is accommodated in the at least one groove and extends under the cover plate.

3. The socket connector of claim 2, further comprising a frame which defines an opening and a plurality of fingers extending into the opening, the insulative housing is located in the opening of the frame and retained by the fingers.

4. The socket connector of claim 3, further comprising a backplane under the printed circuit board and a plurality of fastening members, each of the backplane, the printed circuit board, the frame and the cover plate defines holes for the fastening passing through to retain the backplane, the frame and the cover plate together and to the printed circuit board.

5. The socket connector of claim 4, wherein the fastening member has a screw and a screw nut engaging with the screw.

6. The socket connector of claim 2, wherein the heat pipe retainer is completely located under the cover plate except the post.

7. The socket connector of claim 2, further comprising a plurality of fastening members which retain the cover plate to the printed circuit board, the heat pipe extends out of the socket connector from a position between two adjacent fastening members, so the two adjacent fastening members can prevent the heat pipe retainer from further rotating.

8. A socket connector for electrically connecting an IC package and a printed circuit board, comprising:
    an insulative housing defining a space for receiving the IC package;
    a cover plate being upon the insulative housing;
    a heat pipe retainer located below the cover plate, the heat pipe retainer pivotally connecting with the cover plate; and
    at least one heat pipe, which has a part assembled to the heat pipe retainer and covered by the cover plate.

9. The socket connector of claim 8, wherein the heat pipe retainer defines at least one groove recessed from a top surface thereof, the part of the heat pipe is accommodated in the groove and extends out from an underside of the cover plate.

10. The socket connector of claim 9, further comprising a frame which defines an opening and a plurality of fingers extending into the opening, and the insulative housing is located in the opening of the frame and retained by the fingers.

11. The socket connector of claim 10, further comprising a backplane under the printed circuit board and a plurality of fastening members each of the backplane, the printed circuit board, the frame and the cover plate defines holes for the fastening passing through to retain the backplane, the frame and the cover plate together and to the printed circuit board.

12. The socket connector of claim 9, wherein further comprising a plurality of fastening members which retain the cover plate to the printed circuit board, the heat pipe extends laterally beyond the cover plate from a place between two adjacent fastening members, so the two adjacent fastening members can prevent the heat pipe retainer from further rotating to orientate the heat pipe retainer.

13. An electrical connector assembly comprising:
    a printed circuit board;
    a frame securely mounted upon the printed circuit board;
    an electrical connector mounted to the printed circuit board and around the frame;
    an IC package mechanically and electrically seated upon the electrical connector;
    a heat pipe assembly mechanically and thermally seated upon the IC package; and
    a cover seated upon the heat pipe assembly and assembled to the frame so as to press the heat pipe assembly downwardly against the IC package for hest transfer.

14. The electrical connector assembly as claimed in claim 13, wherein said cover is assembled to the frame via a plurality of fastening devices.

15. The electrical connector assembly as claimed in claim 13, wherein said frame essentially fully circumferentially surrounds the connector.

16. The electrical connector assembly as claimed in claim 15, wherein said frame includes retention devices to hold the IC package in position regard to the connector.

17. The electrical connector assembly as claimed in claim 14, wherein a back plate is position on an undersurface of the printed circuit board, and said fastening devices are engaged with said back plate.

18. The electrical connector assembly as claimed in claim 13, wherein said frame defines a plurality of upward walls to protect the inner connector, and a heat pipe of said heat pipe assembly extends laterally beyond at least one of said upward walls via a gap formed between the cover and said at least one of the upward walls.

19. The electrical connector assembly as claimed in claim 18, wherein there are two said heat pipes arranged in a diagonal direction symmetrically.

20. The electrical connector assembly as claimed in claim 14, wherein said fastening device further extend through the printed circuit board for securing said frame to the printed circuit board.

* * * * *